United States Patent
Schultz

[19]

[11] Patent Number: 6,111,310
[45] Date of Patent: Aug. 29, 2000

[54] RADIALLY-INCREASING CORE POWER BUS GRID ARCHITECTURE

[75] Inventor: Richard T. Schultz, Fort Collins, Colo.

[73] Assignee: LSI Logic Corporation, Milpitas, Calif.

[21] Appl. No.: 09/163,683

[22] Filed: Sep. 30, 1998

[51] Int. Cl.[7] .......................... H01L 23/52; H01L 23/48; H01L 23/34

[52] U.S. Cl. .......................... 257/691; 257/692; 257/723; 257/666; 257/735

[58] Field of Search ..................................... 257/691, 692, 257/723, 666, 735; 438/611, 735

[56] References Cited

U.S. PATENT DOCUMENTS

| | | | |
|---|---|---|---|
| 4,255,672 | 3/1981 | Ohno et al. | 307/455 |
| 4,551,747 | 11/1985 | Gilbert et al. | 357/74 |
| 4,623,911 | 11/1986 | Pryor | 357/45 |
| 4,746,966 | 5/1988 | Fitzgerald et al. | 357/68 |
| 5,145,800 | 9/1992 | Arai et al. | 438/638 |
| 5,311,058 | 5/1994 | Smolley | 257/691 |
| 5,347,150 | 9/1994 | Sakai et al. | 259/203 |
| 5,537,328 | 7/1996 | Ito | 364/489 |
| 5,629,840 | 5/1997 | Hamburgen et al. | 361/820 |
| 5,923,089 | 7/1999 | Yao et al. | 257/775 |

FOREIGN PATENT DOCUMENTS 401204444 8/1989 Japan .

*Primary Examiner*—David Hardy
*Assistant Examiner*—Jhihan B Clark

[57] ABSTRACT

A power bus grid architecture for an integrated circuit including a plurality of main bars assembled along the perimeter of the grid and a plurality of bus bars assembled within the perimeter of the grid. The bus bars are each composed of a plurality of segments with each segment having a substantially constant width. Each segment on certain bus bars has a different width from the next adjacent segment. The width of a particular segment is determined by the distance of the segment from the nearest main power bar. Because the current flow through the segments nearest to the main power bar tends to be greater than the current flow through the segments further from the main power bar, the segments nearest to the main power bar can be made much wider than the segments furthest from the main power bar without significant deleterious effects to the circuit from voltage drops or electromigration.

12 Claims, 4 Drawing Sheets

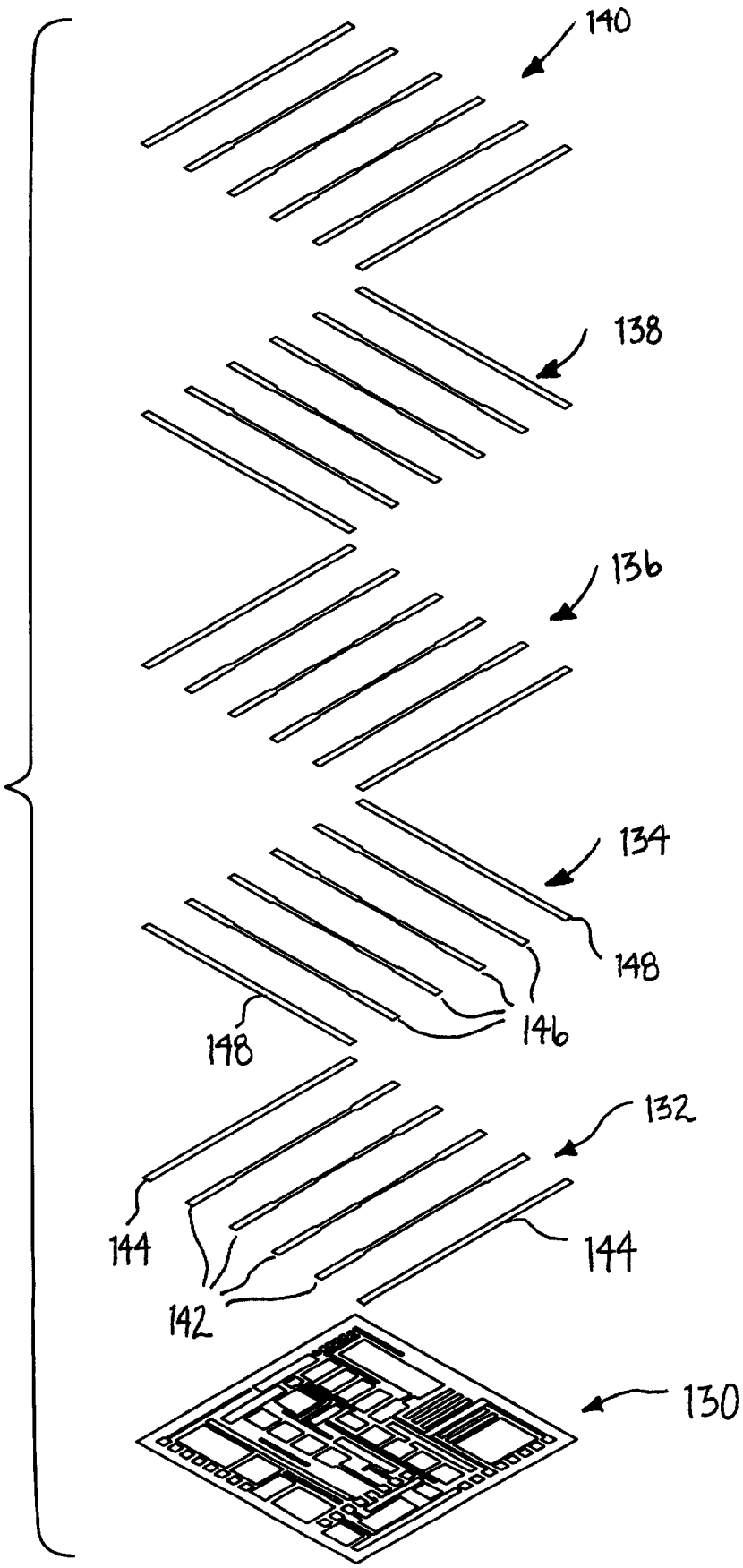

RADIALLY-INCREASING CORE POWER BUS GRID ARCHITECTURE

The present invention relates to an improved power bus grid architecture for integrated circuits, and in particular, the present invention relates to a power bus grid architecture optimized for the amount of current to be carried therethrough.

BACKGROUND OF THE INVENTION

A great number of modern electronic circuits are located in integrated circuits (ICs). ICs feature circuits whose components and conductors connecting the components are made by processing distinct areas of a chip of semiconductor material, such as silicon. The connections between the thousands of circuits include signal lines and power distribution lines to get the supply voltage and ground to the individual circuits.

One type of IC is known as an Application Specific Integrated Circuit (ASIC). Many complex ASIC circuits include a standard power bus architecture provided thereon, often in the form of a grid, with a plurality of bus bars arranged in an orthogonal fashion.

In ICs, there are at least two important design criteria. One is the permissible amount of voltage drop at various points in the power bus grid. The voltage drop along a conductor of a given length is a function of the current flowing through the conductor and the electrical resistance of the conductor. The electrical resistance of a length of conductor is a function of the resistivity of the material that the conductor is composed of, the length of the conductor, and the cross-sectional area of the conductor. Thus, the narrower the cross-sectional of a conductor, for a given length, the higher the resistance will be of the conductor. Accordingly, the voltage drop across one length of conductor is equal to the current flowing therethrough times the resistance. Power bus grid architectures are typically designed with bus bars of a sufficiently-large cross-sectional area throughout so that the voltage drop at the worst case position on the IC (typically the center of the IC) is at an acceptable level.

Another important design criteria for power bus grid architectures in ICs is related to the reliability and/or nominal lifetime of the bus bars and the power bus grid architecture. One primary driver in the reliability/lifetime of an IC is an effect known as electromigration. The electromigration effect causes a gradual deterioration of any conductor as a function of the current density therethrough. Electromigration is the movement of atoms in the conductor because of the interaction between electrons and ions in the conductor under the presence of electrical currents. In other words, as current flows through a conductor, the atoms of the conductor are gradually depleted. With small conductors, significant current densities, and prolonged use, the conductor can eventually be deteriorated away to the point to where a failure in the related circuit is caused, either because of the complete lack of current flow through the conductor, or because of the greatly increased voltage drop through the conductor as a result of the effective cross-sectional area of the conductor being gradually diminished.

Again, as is the case with the voltage drop design criterion, it is typical for power bus grid architectures to be designed conservatively to withstand the predicted amount of electromigration in the bus bars over the desired lifetime of the IC. The necessary cross-sectional area and current density is considered for the worst case position in the power bus grid architecture (which position will vary depending upon the architecture). There are several drawbacks to this conservative design approach typically used in power bus grid architectures. The first is that the conservative approach provides an excessive amount of conductor material in the power bus grid architecture. This is not only a waste of material, but it makes the whole IC larger than would otherwise be necessary. Perhaps more importantly, it exacerbates a common problem in ICs of congestion in the center of the chip.

Of course, as integrated circuit size continues to decrease, these issues become more and more important. For this reason alone, it is important to provide a more optimal power bus grid architecture for ICs.

One prior art attempt to solve some of the above problems is disclosed in U.S. Pat. No. 5,311,058. This disclosure includes a power distribution system for an IC which includes a grid having at least one power bus and one ground bus attached to the top surface of the IC die. The grid is adapted to be electrically coupled with power and ground pins in the IC's package. The grid has an insulated layer on its bottom surface to electrically isolate the grid's bottom surface from the IC. The grid is adapted to cover substantially the entire top surface of the IC and to be electrically coupled by wires directly from the top surface of the grid to terminal or connection points on the top surface of the IC. The connection points can be distributed throughout the IC to reduce the area of metalization in the IC and the path length the current from the power buses must traverse. Unfortunately, this approach suffers from the drawbacks that bonding down to the IC from the grid may be very difficult. It may be difficult to bond wires directly to the integrated circuit without crushing or causing other damage to the circuit.

It is against this background, and the desire to solve the problems of and improve on the prior art, that the above invention has been developed.

SUMMARY OF THE INVENTION

The present invention is directed to an integrated circuit with a plurality of circuits provided on a substrate of semiconductor material. The integrated circuit also includes a power bus grid in electrical communication with the plurality of circuits, wherein the grid has a plurality of main bars and bus bars, the bus bars having a cross-sectional area that varies as a function of the distance from the nearest connection to a main bar.

The cross-sectional area of the bus bars may decrease as the distance from the nearest main bar increases. The cross-sectional area of the bus bars may be substantially constant between connections to other bus bars. The main bars may be connected together in a rectangular shape proximate to a perimeter of the integrated circuit. The cross-sectional area of the bus bars may be relatively smaller at a center of the integrated circuit than near the main bars.

The main bars may be connected together in a rectangular shape proximate to a perimeter of the integrated circuit. The power bus grid further may include multiple layers of grids with a plurality of main bars and bus bars, the bus bars having a cross-sectional area that varies as a function of the distance from the nearest connection to a main bar. The power bus grid may be attachable to a power supply that supplies a supply voltage between a pair of conductors, at least one of the multiple layers of the power bus grid being attachable to a first one of the pair of conductors and at least one other of the multiple layers of the power bus grid being attachable to the other of the pair of conductors, to supply the supply voltage to the plurality of circuits. The main bars have a cross-sectional area that may be substantially equal to or greater than the cross-sectional area of the bus bars. At least a portion of the power bus grid overlays the plurality of circuits.

The present invention is also directed to an integrated circuit including a plurality of circuits provided on a substrate of semiconductor material. The integrated circuit also includes a power bus grid in electrical communication with the plurality of circuits, wherein the grid has a plurality of main bars and bus bars, the bus bars having portions that are relatively closer to the main bars and portions that are relatively further from the main bars, wherein the closer portions have a cross-sectional area that is relatively greater than a cross-sectional area of the further portions.

The present invention is also directed to an integrated circuit including a plurality of circuits provided on a substrate of semiconductor material. The integrated circuit also includes a power bus grid including multiple, spaced-apart, substantially-planar layers, with each layer including a generally rectangular arrangement of main bars connectable to a power supply, each layer also including a plurality of bus bars arranged in the shape of a grid, wherein each bus bar includes a plurality of segments, the bus bars having segments that are relatively closer to the main bars and segments that are relatively further from the main bars, wherein the closer segments have a cross-sectional area that is relatively greater than a cross-sectional area of the further segments.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention.

In the Drawings:

FIG. 6 is an exploded perspective view of an integrated circuit of the present invention, showing the multiple layers of the power bus grid.

DETAILED DESCRIPTION OF THE PREFERRED EMBODIMENTS

Figure 1:
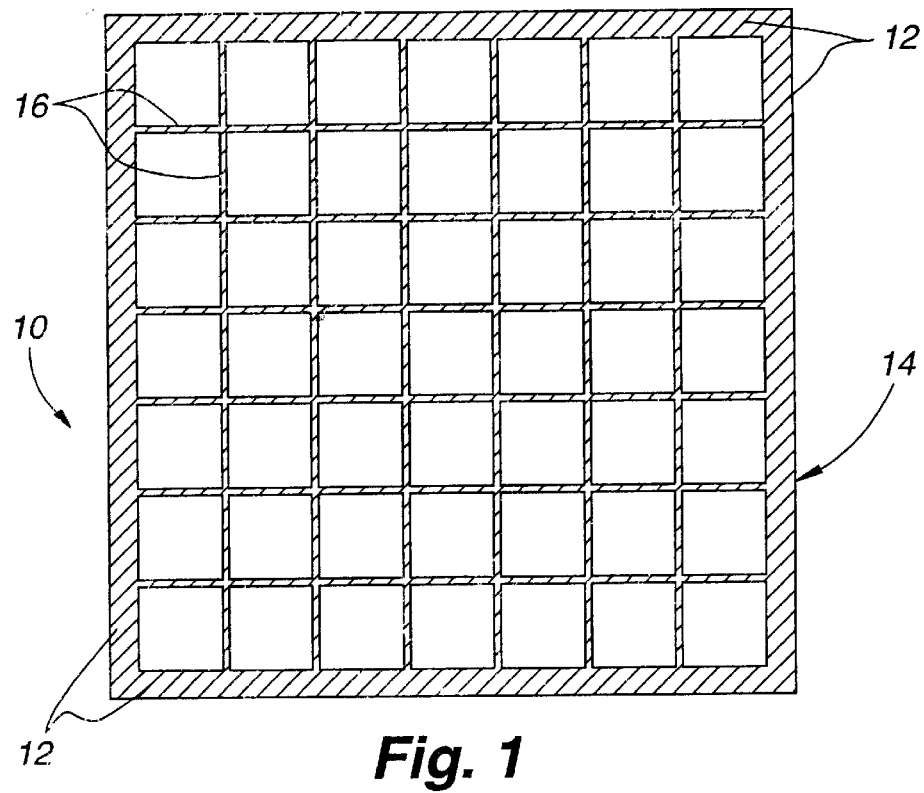
FIG. 1 is a plan view of a power bus grid of the prior art.
Figure 2:
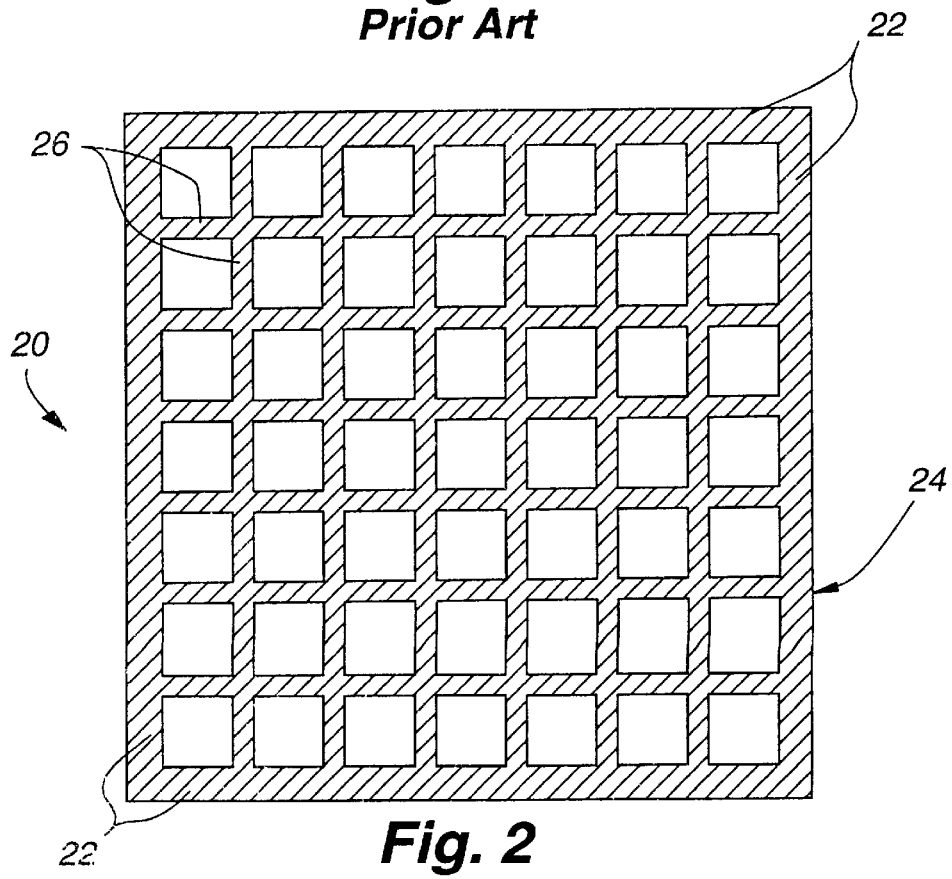
FIG. 2 is a plan view of a second power bus grid of the prior art.

A prior art power bus grid 10 is shown in FIG. 1. The grid 10 includes four main power bars 12 arranged to form a square 14 that corresponds to the outer perimeter of an integrated circuit (not shown) on which the power bus grid 10 may be provided. The grid 10 also includes a plurality of bus bars 16 interconnecting each of the opposed main power bars 12 of the square 14. When arranged in this manner, the bus bars 16 are located orthogonally to each other, and when regularly spaced apart from each other by a substantially constant distance, the resulting grid of bars is an x-y grid. If the voltage drop at any point within a prior art integrated circuit design reached an unacceptable level, the prior art solution has been to merely increase the thickness, or cross-sectional area, of the bus bars as is shown in the grid 20 of FIG. 2. In a similar fashion to the grid 10 of FIG. 1, the grid 20 (FIG. 2) includes four main power bars 22 arranged in the shape of a square 24. A plurality of bus bars 26 are provided to interconnect the main power bars 22 in the shape of an x-y grid, in a similar fashion to the grid 10. As can be appreciated, the bus bars 26 are significantly wider, and thus have a significantly larger cross-sectional area than the bus bars 16. In the case of the grid 20, with everything else being the same, the voltage drop at various points in the circuit associated with the grid 20 will be less significant than with the grid 10.

Figure 3:
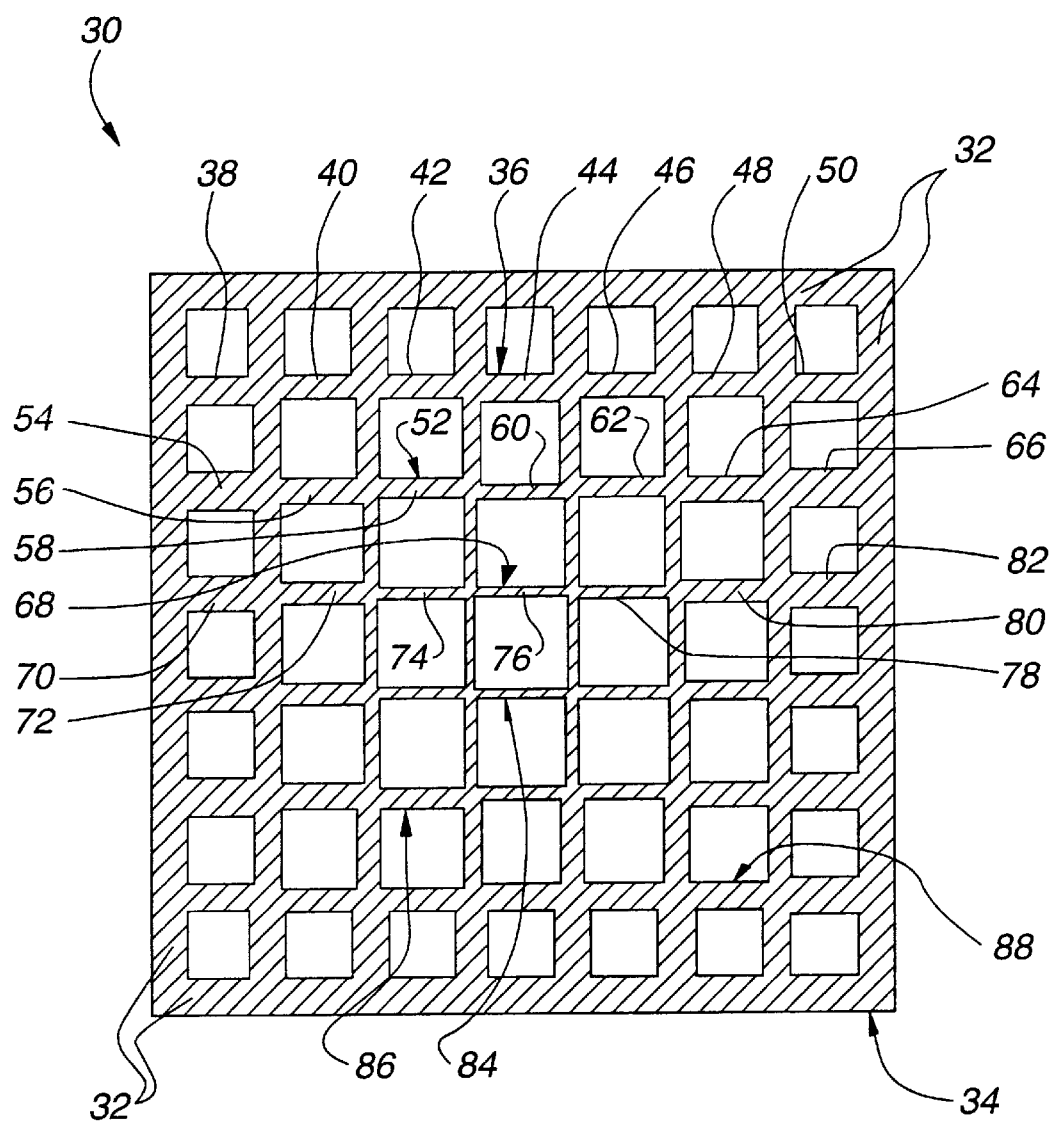
FIG. 3 is a plan view of a power bus grid of the present invention.

A power bus grid 30, as shown in FIG. 3, has been developed to solve the problems of the prior art. It has been recognized that the current flow will generally be greater along the portions of the bus bars that are closest to the main power bars. Accordingly, these segments of the bus bars will be most susceptible to electromigration effects. It follows, then, that the segments of the bus bars furthest from a main power bar will generally have relatively lower current flow and thus will be relatively less susceptible to electromigration effects. It has also been discovered that, with the current being greater in the segments of the bus bars closest to the main power bars, the relative amount of voltage drop per unit length of bus bar is greatest in these areas with the greatest current. In other words, voltage drops the most per unit length in the segments of the bus bar closest to the main power bars.

The new power bus grid 30 of the present invention has an arrangement of four main power bars 32 in the shape of a square 34. In the present invention, the opposed main power bars 32 are connected by bus bars 36, 52, and 68 that are each composed of a plurality of segments. For example, segments 38, 40, 42, 44, 46, 48, and 50 make up one bus bar 36. With this bus bar 36, it can be seen that the thickness of segments 38 and 40 generally correspond to the thickness of the main power bars 32. The remaining segments, 40, 42, 44, 46, and 48 have a reduced width relative to the segments 38 and 50. These reduced-width segments may be in the range of 50% of the width of the larger segments. As can be seen, another bus bar 52 is composed of segments 54, 56, 58, 60, 62, 64, and 66. On this bus bar 52, segments 54 and 66, which are closest to an adjacent main power bar 32, are of the thickest width. Next, segments 56 and 64, which are adjacent to segments 54 and 66, are of the next smaller width. The smaller width segments may have a width approximately 50% of the larger width segments. Segments 58, 60, and 62, which are relatively further from the nearest main power bar 32 than segments 54, 56, 64, and 66, are of a still further reduced thickness. The width of the segments 58, 60, and 62 may be approximately 50% of the width of the segments 56 and 64.

As can be seen, another bus bar 68 includes segments 70, 72, 74, 76, 78, 80, and 82. Segments 70 and 82, which are closest to the adjacent main power bars 32, have the relatively thickest width. Segments 72 and 80, which are adjacent to segments 70 and 82, respectively, have the next thickest width, being reduced by approximately 50% in width. Segments 74 and 78, which are adjacent to segments 72 and 80, respectively, have a still further reduced thickness, that is approximately 50% of the thickness of segments 72 and 80. Segment 76, being the segment furthest from the nearest main power bar 32, has the relatively smallest thickest width, and is approximately 50% in width as compared to the width of segments 74 and 78 to which it is adjacent.

Generally, the lower half of the grid 30 is a mirror image of the upper half of the grid 30, so that bus bars 84, 86, and 90, resembling and corresponding to the three bus bars 68, 52, and 36, respectively, are located on the lower half of the grid 30. In addition, the grid 30 is also symmetrical about diagonal lines which could be drawn therethrough. Accordingly, the vertically-oriented bus bars 36, 52, 68, 84, 86, and 88 in FIG. 3 are similar to the horizontally-oriented bus bars 36 in FIG. 3, and will not be described in further detail.

Figure 4:
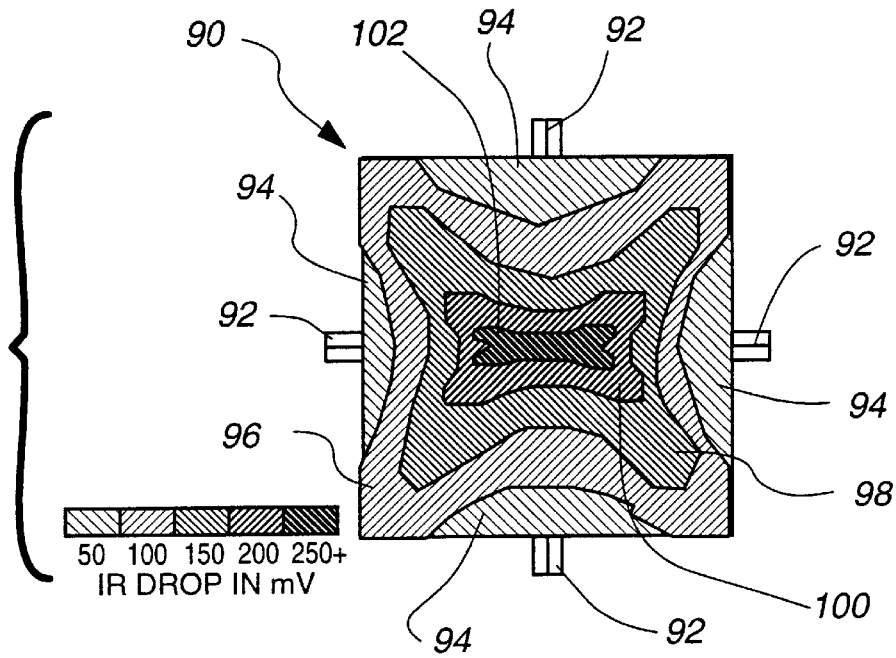
FIG. 4 is a graphical representation of the voltage drop at various points throughout an integrated circuit of the prior art.

A graphical representation 90 of the typical voltage drop at various points in a typical prior art integrated circuit is shown in FIG. 4. As can be seen from the legend, an area with a voltage drop in the range of 50 millivolts is concentrated around each of a plurality of pads 92. Another region 96 having a voltage drop in the range of 100 millivolts is adjacent to the region 94. A region 98 with a 150 millivoltage drop is inside of the region 96. A region 100, with a nominal voltage drop of 200 millivolts, is located inside of the region 98. A region 102, with a voltage drop of 250 millivolts or greater, is located inside of the region 100. As can be appreciated, a significant voltage drop appears throughout a significant portion of the prior art integrated circuit.

Figure 5:
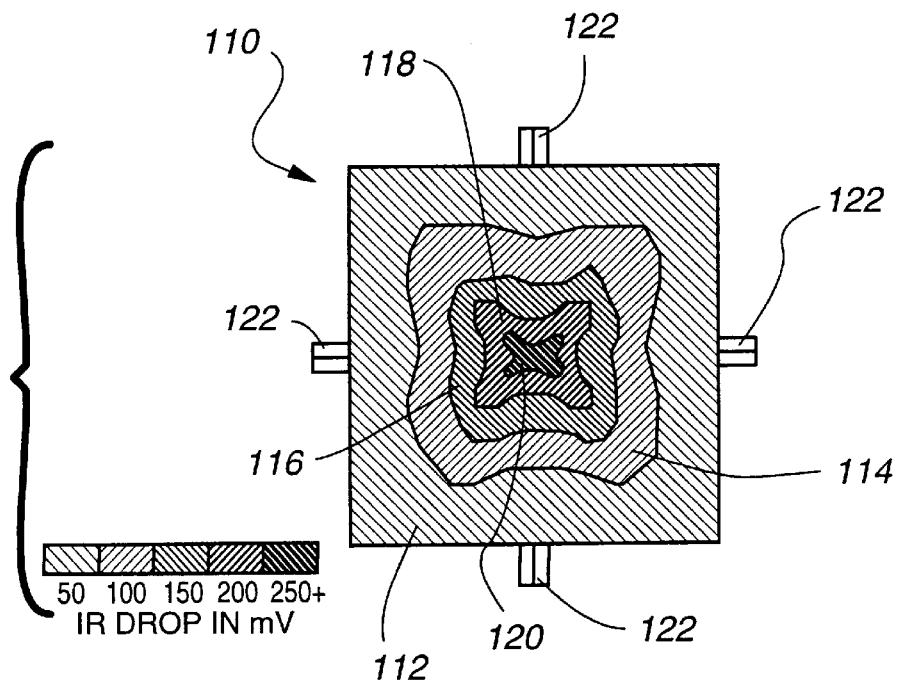
FIG. 5 is a graphical representation of the voltage drop throughout an integrated circuit constructed according to the present invention and including the power bus grid of FIG. 3.

By comparison, the graphical representation 110 in FIG. 5 shows the voltage drop in an improved integrated circuit when the power bus grid of the present invention, shown in FIG. 3, is employed. In this representation 110, a first region 112 located along the entire periphery of the integrated circuit shows an area where the voltage drop is in the range of 50 millivolts. Inside of the first region 112 is a second region 114, where the voltage drop is in the range of 100 millivolts. Inside of the second region 114 is a third region 116, where the voltage drop is in the range of 150 millivolts. Inside of the third region 116 is a fourth region 118, where the voltage drop is in the range of 200 millivolts. Inside of the fourth region 118 is a relatively small fifth region 120 in which the voltage drop is 250 millivolts or more. As can be appreciated, the areas on the improved integrated circuit which include a significant voltage drop is greatly reduced from the areas with a significant voltage drop in the prior art integrated circuit. Of course, the circuit designer can place components as desired at positions on the integrated circuit where the nominal voltage drop will correspond to the acceptable voltage drop for the particular component to be employed. In other words, those components with the greatest tolerance for a significant voltage drop can be placed in the fifth region 120 and those components with the least tolerance for a significant voltage drop can be placed in the first region 112.

In addition, because the current levels will be greater in the bus bar segments located closest to a main power bar, the electromigration effect is greatest in these segments. Having the relatively widest segments in these locations helps to mitigate against the effects of electromigration so that the reliability of an integrated circuit can be increased without increasing the overall amount of material used in the power bus grid. Similarly, the segments of the bus bars located furthest from the main power bar carry the least amount of current and, thus, the electromigration effects are smallest in these segments. Accordingly, the relatively narrowest segments can be employed in these positions, since the effects of electromigration are reduced.

The power bus grid 30 (FIG. 3) of the present invention has been simplified for ease of illustration and description. When implemented in an actual integrated circuit, the grid will be scaled as appropriate for the size and complexity of the circuit. For example, there may be a great deal more bus bars than has been described. The salient principles as described, including the varying width of the bus bars as a function of the current likely to flow therethrough, would still apply.

Of course, the grid 30 of FIG. 3 is a simplified version of the power bus grid architecture that is actually implemented in an integrated circuit. This simplified version has been used to more easily explain and illustrate the present invention. The actual implementation includes a circuit layer 130 and multiple grid layers, including five layers 132, 134, 136, 138, and 140, such as is shown in FIG. 6. One entire layer 132 may have only a plurality of parallel bus bars 142 extending in a first direction, with parallel main power bars 144 on either side. An adjacent layer 134 may have a plurality of parallel bus bars 146 extending in a second direction that is orthogonal to the first direction, with parallel main power bars 148 on either side. The adjacent layers 130, 132, 134, 136, 138, and 140 may be electrically connected together by vias (not shown).

The foregoing description is considered as illustrative only of the principles of the invention. Furthermore, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

The invention claimed is:

1. An integrated circuit, comprising:
   a plurality of circuits provided on a substrate of semiconductor material; and
   a power bus grid in electrical communication with the plurality of circuits, wherein the grid has a plurality of main bars and bus bars, the bus bars having a cross-sectional area that varies as a function of the distance from the nearest connection to a main bar.

2. An integrated circuit as defined in claim 1, wherein the cross-sectional area of the bus bars decreases as the distance from the nearest main bar increases.

3. An integrated circuit as defined in claim 1, wherein the main bars are connected together in a rectangular shape proximate to a perimeter of the integrated circuit.

4. An integrated circuit as defined in claim 1, wherein the power bus grid further includes multiple layers of grids with a plurality of main bars and bus bars, the bus bars having a cross-sectional area that varies as a function of the distance from the nearest connection to a main bar.

5. An integrated circuit as defined in claim 1, wherein the main bars have a cross-sectional area that is substantially equal to or greater than the cross-sectional area of the bus bars.

6. An integrated circuit as defined in claim 1, wherein at least a portion of the power bus grid overlays the plurality of circuits.

7. An integrated circuit as defined in claim 2, wherein the cross-sectional area of the bus bars is substantially constant between connections to other bus bars.

8. An integrated circuit as defined in claim 7, wherein the main bars are connected together in a rectangular shape proximate to a perimeter of the integrated circuit.

9. An integrated circuit as defined in claim 8, wherein the cross-sectional area of the bus bars is relatively smaller at a center of the integrated circuit than near the main bars.

10. An integrated circuit as defined in claim 4, wherein the power bus grid is attachable to a power supply that supplies a supply voltage between a pair of conductors, at least one of the multiple layers of the power bus grid being attachable to a first one of the pair of conductors and at least one other of the multiple layers of the power bus grid being attachable to the other of the pair of conductors, to supply the supply voltage to the plurality of circuits.

11. An integrated circuit, comprising:

a plurality of circuits provided on a substrate of semiconductor material; and a power bus grid in electrical communication with the plurality of circuits, wherein the grid has a plurality of main bars and bus bars, the bus bars having portions that are relatively closer to the main bars and portions that are relatively further from the main bars, wherein the closer portions have a cross-sectional area that is relatively greater than a cross-sectional area of the further portions.

12. An integrated circuit, comprising:

a plurality of circuits provided on a substrate of semiconductor material; and a power bus grid including multiple, spaced-apart, substantially-planar layers, with each layer including a generally rectangular arrangement of main bars connectable to a power supply, each layer also including a plurality of bus bars arranged in the shape of a grid, wherein each bus bar includes a plurality of segments, the bus bars having segments that are relatively closer to the main bars and segments that are relatively further from the main bars, wherein the closer segments have a cross-sectional area that is relatively greater than a cross-sectional area of the further segments.

* * * * *